US005418530A

United States Patent [19]

[11] Patent Number: 5,418,530

[45] Date of Patent: May 23, 1995

Moore et al.

[54] KEY WITH SILENT RETURN MOVEMENT

[75] Inventors: Earl W. Moore, Houston; Ronald R. Brown, Tomball, both of Tex.

[73] Assignee: Compaq Computer Corporation, Houston, Tex.

[21] Appl. No.: 960,571

[22] Filed: Oct. 13, 1992

Related U.S. Application Data

[63] Continuation of Ser. No. 708,177, May 31, 1991, abandoned.

[51] Int. Cl.[6] ...................... H03M 11/00; H01H 13/00

[52] U.S. Cl. ......................................... 341/22; 341/34; 200/345; 200/512

[58] Field of Search .................. 200/5 D, 16 B, 16 D, 200/510, 512–517, 541, 341, 344, 5 R, 5 A, 509, 521, 539, 548, 345; 341/22, 27, 34

[56] References Cited

U.S. PATENT DOCUMENTS

| | | | |
|---|---|---|---|
| 3,856,998 | 12/1974 | Sims, Jr. | 200/5 A |
| 4,864,085 | 9/1989 | Hanajima et al. | 200/5 A |
| 5,057,657 | 10/1991 | Skulic | 200/521 |
| 5,144,103 | 9/1993 | Suwa | 200/344 |

*Primary Examiner*—John K. Peng
*Assistant Examiner*—Andrew Hill
*Attorney, Agent, or Firm*—Christopher D. Keirs

[57] ABSTRACT

Several unique features of a key switch housing and plunger are disclosed which may be employed to provide a keyboard having improved noise and feel characteristics. A system of key plunger up-stops is used to reduce the noise produced by key return while preventing removal of the plunger from the chimney of the switch housing. The system comprises a pair of relatively weak and resilient up-stops which have a relatively small contact area which act to restrict upward movement of the keycap/plunger combination during normal operation and a pair of relatively strong and rigid up-stops which do not contact the switch housing during normal keyboard use, but which prevent the pull-out of the key switch plunger from the chimney of the key switch housing. An additional feature disclosed is a unique key switch housing and plunger design which minimizes key wobble while providing smooth key action. In contrast to the devices of the prior art, the plunger and interior wall of the chimney of the key switch housing are provided with approximately equal tapers which tapers are aligned so as to provide bearing surfaces which are approximately parallel to one another when the key switch plunger is in the "up" (i.e., nondepressed) position. The direction of the tapers is chosen such that key depression results in progressively greater tolerance between the bearing surfaces.

1 Claim, 4 Drawing Sheets

Fig. 1
(PRIOR ART)
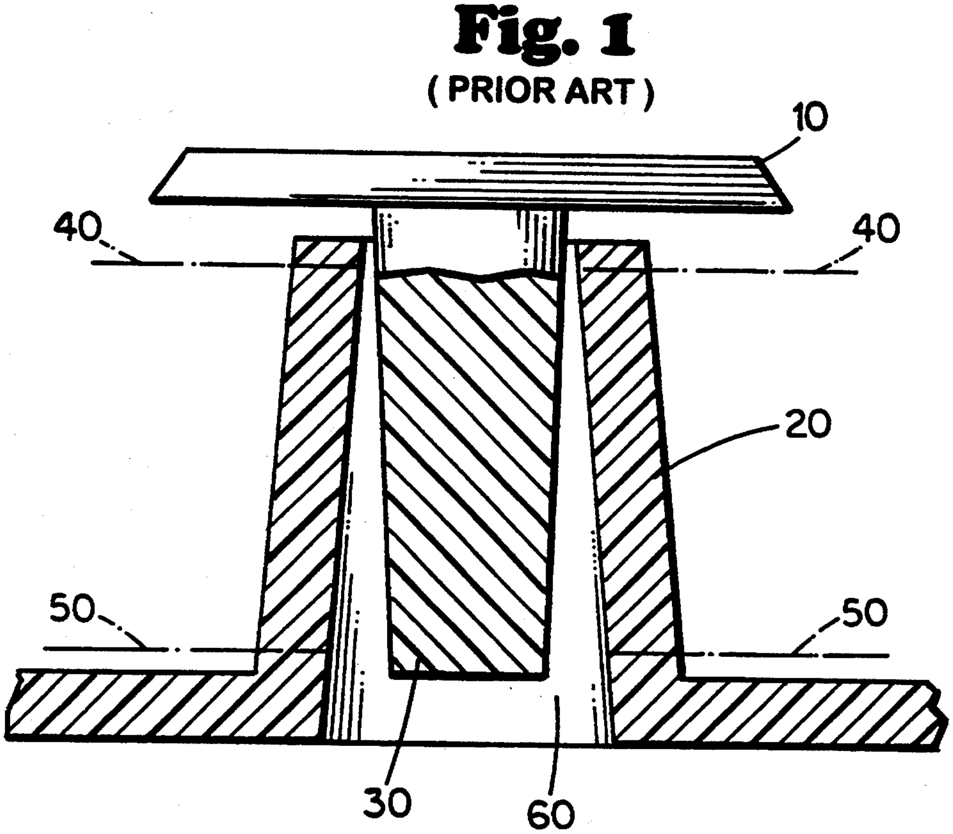
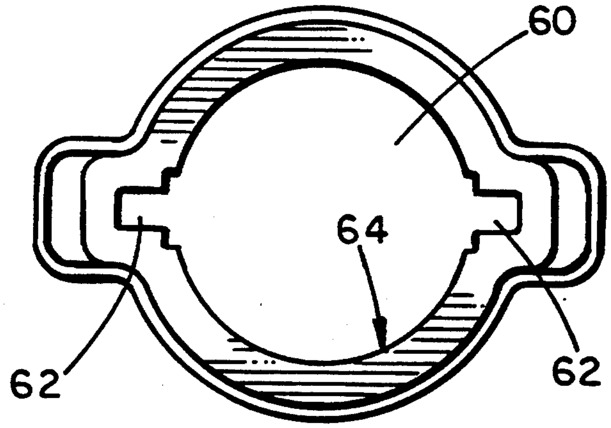
Fig. 7

KEY WITH SILENT RETURN MOVEMENT

This is a continuation of co-pending application Ser. No. 708,177 filed May 31, 1991, abandoned.

BACKGROUND OF THE INVENTION

1. Field of the Invention

This invention relates to press-to-actuate type switches. More particularly, it relates to electromechanical keyboards of the type commonly used on office equipment such as personal computers.

2. Description Of the Related Art

Alpha-numeric keyboards of the type used for personal computers and the like typically comprise an electrical switch, a resilient member such as a spring or a rubber dome, a plunger, a keycap, and a switch housing which provides a guide for the action of the plunger. Most commonly, the keycap is attached to the upper end of the plunger (or the keycap and plunger are fabricated as a single unit) and the lower end of the plunger bears against the resilient member which provides a resistance to the downward action of the plunger and returns the keycap to its rest position (up position) when finger pressure on the keycap is released. In many keyboards, the under or lower surface of the resilient member contacts a membrane-type electrical switch when the resilient member is compressed by depressing the keycap. This switch action is electrically communicated to the host device (e.g., a computer) and is interpreted as a key actuation.

The "feel" of a keyboard is determined by a number of factors. A principal factor is the fit of the plunger within the switch housing (i.e., the dimensions and tolerances thereof). A common plunger and switch housing design of the prior art is illustrated in cross section in FIG. 1. Keycap 10 is attached to plunger 30 which is inserted into opening 60 of switch housing 20. Most commonly, plunger 30 and opening 60 will be generally circular in a cross section perpendicular to that shown in FIG. 1. The opening 60 in switch housing 20 which receives plunger 30 is often referred to in the art as a "chimney". For purposes of illustration, the taper of chimney 60 and plunger 30 are exaggerated in FIG. 1. In a design of the type shown, the diameter of plunger 30 at line 40 is greater than that at line 50. Conversely, the diameter of chimney 60 is less at line 40 than at line 50.

The use of tapers (or "drafts" or "draft angles") on keyboard members such as those illustrated in FIG. 1 have a number of advantages. Since these parts are most commonly fabricated of plastics by injection molding techniques, a draft angle facilitates the release of the part from the mold at the end of the molding cycle. Moreover, the taper of the plunger enables one to easily insert the plunger into the chimney of the switch housing from the upper surface of the switch housing thereby facilitating the assembly of the keyboard.

A particular disadvantage of this sort of plunger/-chimney design is that the "fit" of the plunger is loosest (i.e., the clearance between the plunger and chimney walls is greatest) when the key is the rest (i.e., nondepressed) position. This contributes to a "loose feel" or "wobble" of the keycap when a typist's fingers are resting on the "home keys" of the keyboard. Users typically associate this "loose feel" with low keyboard quality; hence, it is undesirable. The present invention is directed, in part, to solving this problem.

Keycap/plunger combinations of the type illustrated in FIG. 1 are commonly secured in chimney 60 by means of tabs or barbs (not shown) which are molded into the plunger with corresponding tab-engaging surfaces molded into the switch housing. Such devices provide a positive "up stop" for the key and prevent the plunger from being pulled out of the chimney. However, when an up stop engages, it usually produces a sound which is audible to users. It has been found that users of computer keyboards (particularly touch typists) find this sound objectionable. While users express a preference for audible feedback upon key switch activation, a sound produced by a keyboard upon key release is undesirable. It is contemplated that this sound is undesirable because it occurs at the "wrong" time in the keystroke cycle. The present invention solves these problems.

SUMMARY OF THE INVENTION

In the present invention, several unique design features of a key switch housing and plunger are employed to provide a keyboard having improved noise and feel characteristics. A system of key plunger up-stops is used to reduce the noise produced by key return while preventing removal of the plunger from the chimney of the switch housing. The system comprises a pair of relatively weak and resilient up-stops which have a relatively small contact area which act to restrict upward movement of the keycap/plunger combination during normal operation (hereinafter "soft up-stops") and a pair of relatively strong and rigid up-stops which do not contact the switch housing during normal keyboard use, but which prevent the pull-out of the key switch plunger from the chimney of the key switch housing (hereinafter "hard up-stops").

An additional feature of the present invention is a unique key switch housing and plunger design which minimizes key wobble while providing smooth key action. In contrast to the devices of the prior art, the plunger and interior wall of the chimney of the key switch housing are provided with approximately equal tapers which tapers are aligned so as to provide bearing surfaces which are approximately parallel to one another when the key switch plunger is in the "up" (i.e., nondepressed) position. The direction of the tapers is chosen such that key depression results in progressively greater tolerance between the bearing surfaces.

BRIEF DESCRIPTION OF THE DRAWINGS

FIG. 1 is a cross sectional view of a key switch of the prior art which comprises a keycap/plunger combination inserted into the chimney of a switch housing.

FIG. 7 is a top plan view of a switch housing of the present invention.

DETAILED DESCRIPTION

Figure 2:
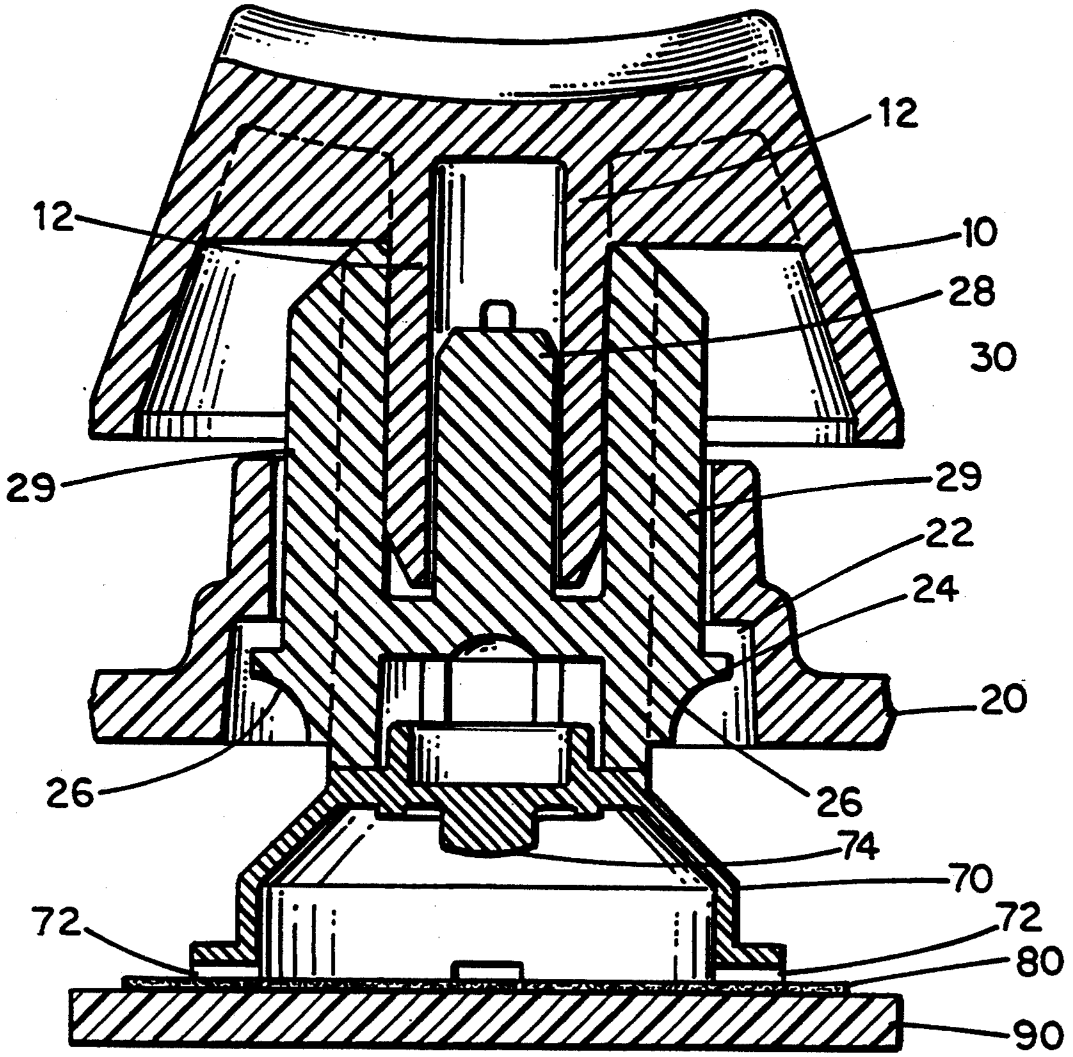
FIG. 2 is a cross sectional view of a single key switch which embodies the present invention.

One preferred embodiment of the present invention is described in detail immediately below and can best be understood by reference to the drawing figures.

A key switch which embodies the present invention is shown in cross section in FIG. 2 wherein keycap 10 is attached to plunger 30 which is carried in switch housing 20. In a typical keyboard for use with personal computer, housing 20 is one of a series of such switch housings equal in number to the number of keys on the keyboard. It is convenient to fabricate this array of switch housings as a single, injection-molded plastic part which is commonly referred to as a "monoblock". A preferred material for fabricating the monoblock by injection molding is Noryl PX4639 polyphenylene oxide filled with 3% Teflon tetrafluoroethylene polymer. It should be understood that the improvements described herein may be advantageously applied to all the key switches of a keyboard.

Keycap 10 includes mounting member 12 which is held in plunger 30 by being pressed into the cavity in plunger 30 surrounding central post 28.

Switch housing 20 includes shoulder 22 which acts in concert with hard up-stop 24 to prevent removal of plunger 30 from housing 20 in the direction of the keycap 10.

The bottom surface of plunger 30 bears against rubber dome 70 which is a resilient member which provides a controlled resistance to the downward movement of plunger 30 when keycap 10 is depressed and acts to return plunger 30 to its rest position (up position) when pressure on keycap 10 is released. Rubber dome 70 is mounted to mylar sheet 72 immediately above switch membrane 80 which contains the electrical switch elements which convert the mechanical movement of the keycap 10 to an electrical signal. Membrane 80 is supported by support plate 90 which is typically fabricated from sheet metal.

In operation, depressing keycap 10 causes plunger 30 to exert a downward force on rubber dome 70. At a predetermined pressure on keycap 10, rubber dome 70 collapses causing contact nipple 74 to press against switch membrane 80 at a location corresponding to a particular associated electrical switch in the switch membrane 80. Hard up-stop 24 is provided with radiused edge 26 to accommodate the collapsing walls of rubber dome 70 when keycap 10 is depressed.

FIG. 2 depicts the key switch in its undepressed state. It should be noted that in this state hard up-stop 24 does not contact shoulder 22 of switch housing 20 - i.e., a clearance is provided which prevents the hard up-stop 24 from contacting the switch housing 20 during normal operation. If sufficient upward force is applied to keycap 10, it will separate from plunger 30, but plunger 30 will be retained in housing 20 by the action of hard up-stop 24.

Figure 3:
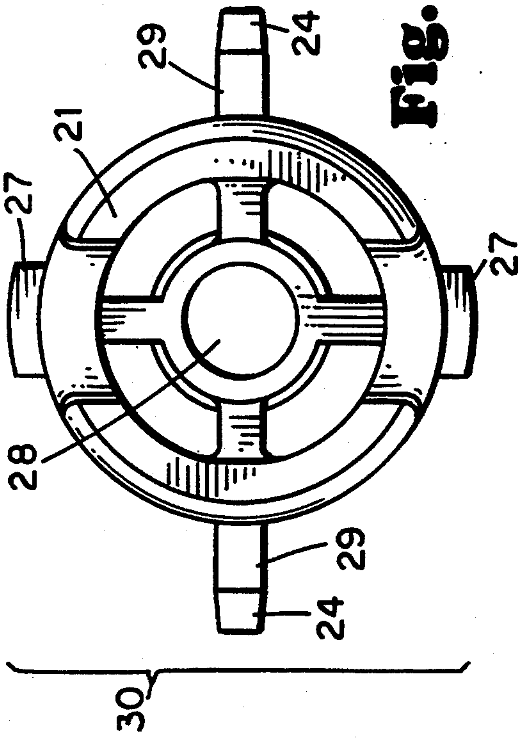
FIG. 3 is a top plan view of a key switch plunger which embodies the present invention.

A top plan view of plunger 30 is shown in FIG. 3 in which it can be seen that hard up-stop 24 are formed as part of antirotation ribs 29 which are carried in a corresponding channel in the switch housing to prevent rotational movement of the keycap/plunger combination. Plunger 30 comprises outer column 21 and central post 28. The cavity between column 21 and post 28 receives mounting member 12 of keycap 10 and is sized to provide a press fit. One preferred material for fabricating plunger 30 by an injection molding process is Celcon M270 acetyl resin manufactured by Celanese Corporation.

Also visible in FIG. 3 are soft up-stop 27 which comprise tabs projecting radially from the plunger 30 near the junction of the side walls and bottom surface of the plunger 30. In the illustrated embodiment, soft up-stop 27 are disposed 180 degrees from each other and 90 degrees from the hard up-stop 24. Most preferably, soft up-stop 27 have minimal contact area with switch housing 20 and are only sufficiently stiff to the degree necessary to prevent plunger 30 from extending further than that shown in FIG. 2. The minimal surface contact area of soft up-stop 27 combined with its flexibility minimizes keyboard noise by reducing "slap" and vibration on the return stroke of the key switch.

Figure 6:
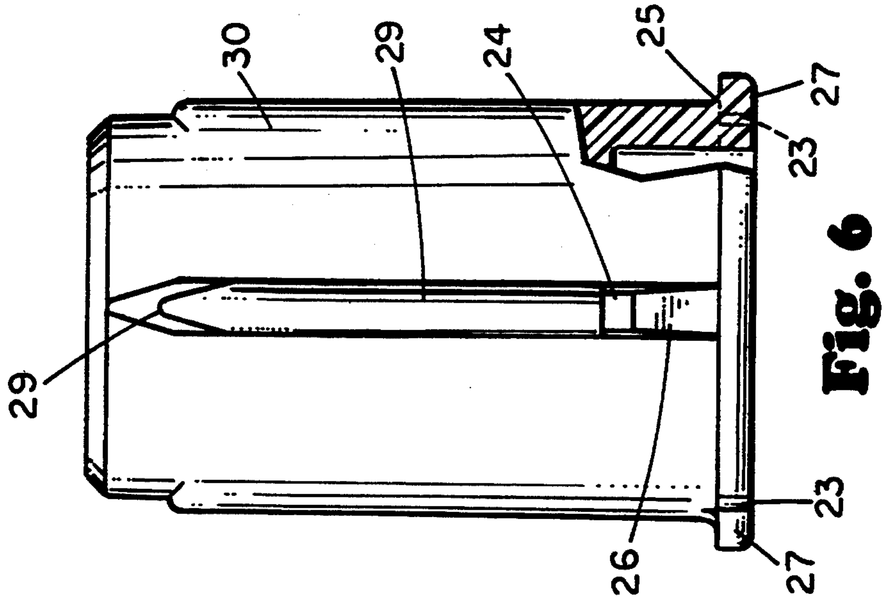
FIG. 6 is a partially cut-away view of a key switch plunger which embodies the present invention.
Figure 4:
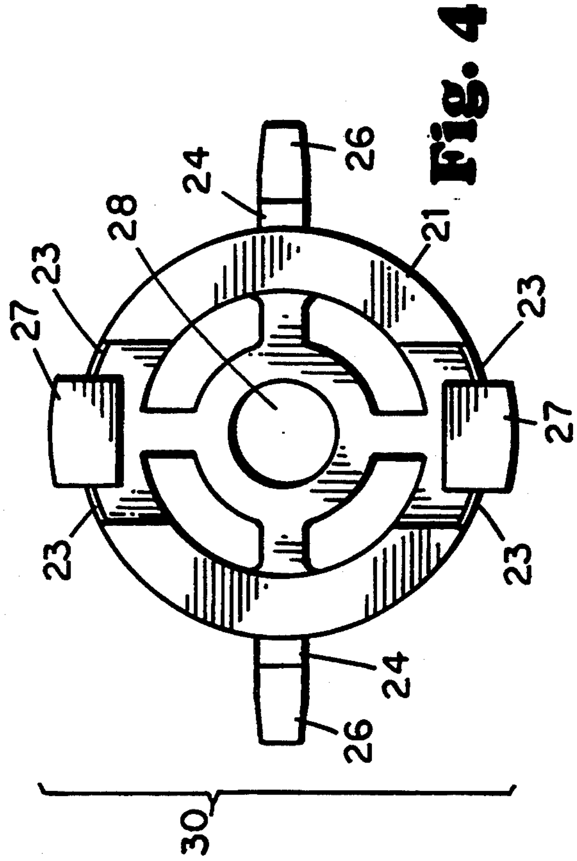
FIG. 4 is a bottom plan view of a key switch plunger which embodies the present invention.

FIG. 4 is a bottom plan view of plunger 30 showing thinner wall sections 23 in outer column 21 which flexibly support soft up-stop 27. This feature can also be seen in the partial cut-away view of FIG. 6. Also illustrated in FIG. 6 is radiused inside corner 25 of soft up-stop 27 which functions to urge up-stop 27 towards the interior of plunger 30 as it contacts the bottom edge of chimney 60 on the return stroke of the key switch. This motion is resisted by the flexible nature of soft up-stop 27 which provides a dampening action.

Figure 5A:
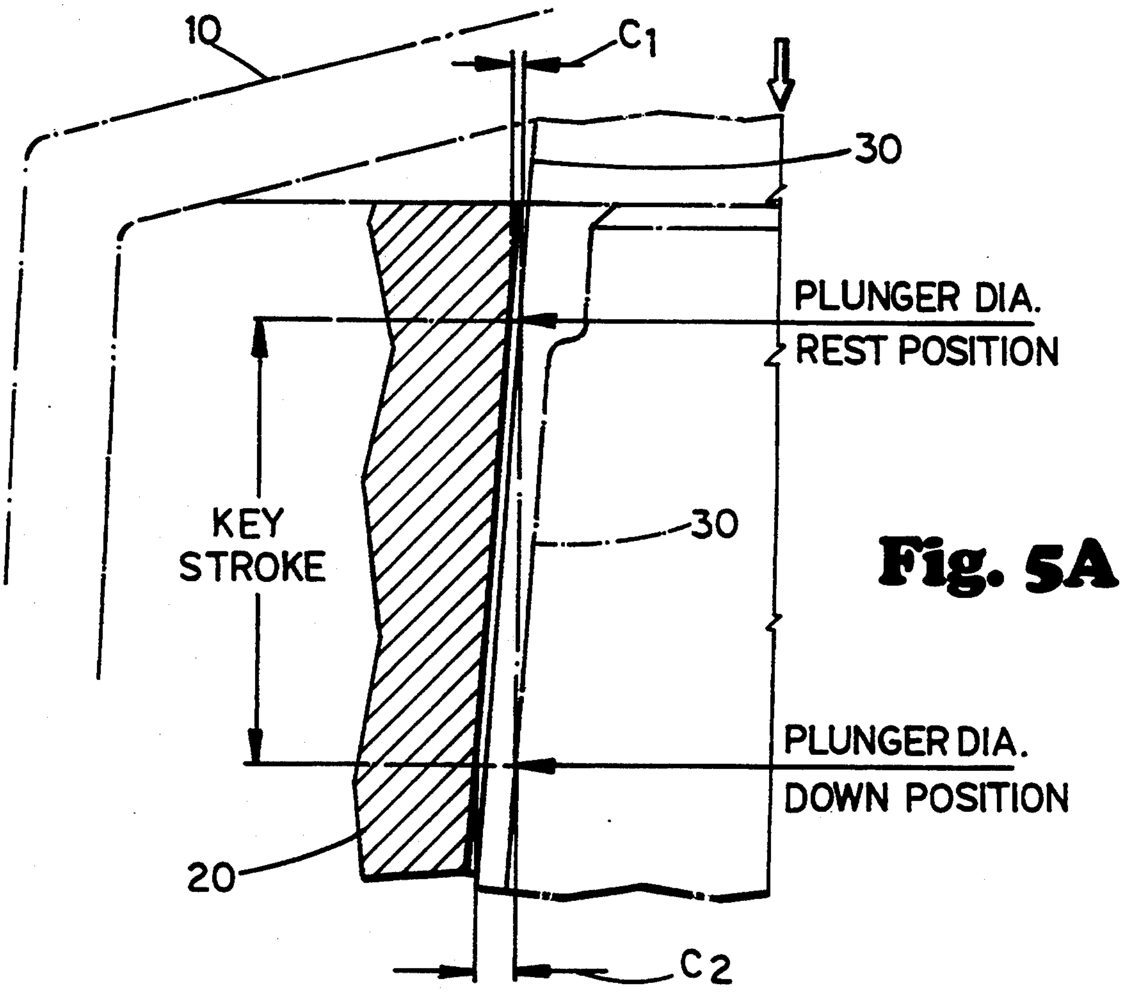
FIG. 5A is an enlarged partial cross sectional view of the plunger and switch housing of FIG. 5 with the draft angle exaggerated to show detail.
Figure 5:
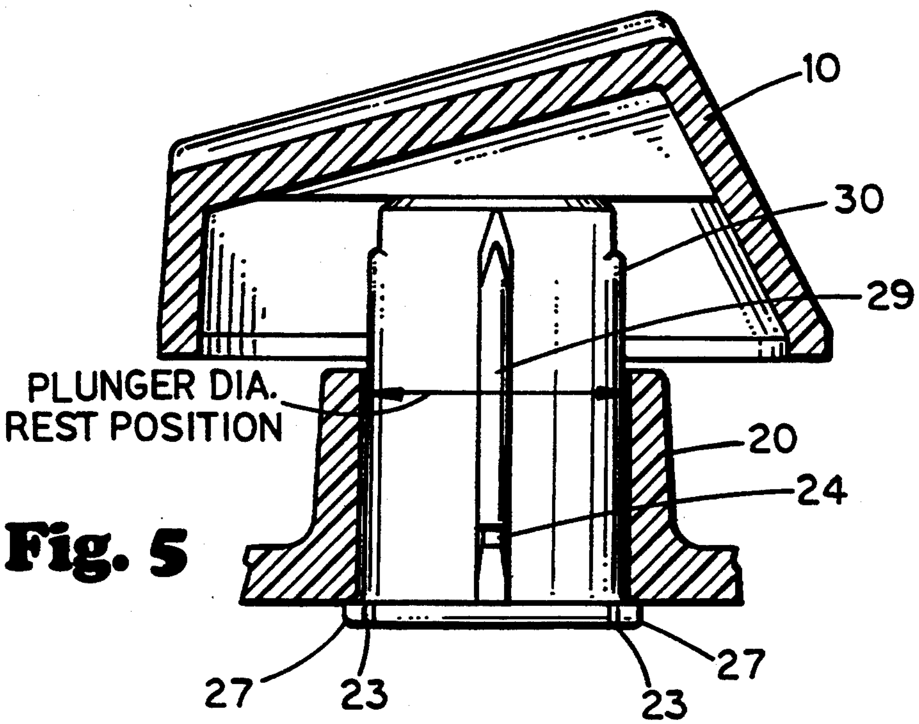
FIG. 5 is a partial cross sectional view of a plunger and switch housing which embody the present invention.

FIG. 5 is a cross sectional view of the key switch showing soft up-stop 27 in contact with the under surface of housing 20. This cross section is taken through a plane which is 90 degrees from that of FIG. 2.

The double up-stop system of the present invention provides minimal noise (owing to the action of the soft up-stop 27) while maintaining adequate pull-out resistance (provided by hard up-stop 24).

In FIG. 5A, one side of the plunger/housing interface at the line shown in FIG. 5 is shown enlarged with the preferred draft angle exaggerated for purposes of illustration. FIG. 5A illustrates how a progressively greater clearance between the plunger and the housing obtains as the key of the present invention is depressed.

FIG. 7 is a top plan view of a switch housing. Chimney 60 is defined by inner wall 64. Also visible in FIG. 7 are anti-rotation channels 62 in wall 64 which accommodate antirotation ribs 29 on plunger 20. To enhance smoothness of action and minimize noise, it has been found preferable to lubricate wall 64 with a lubricant such as a liquid silicone.

As noted above, an important feature of this invention is the taper or "draft" applied to plunger 30 and inner wall 64 of chimney 60. It has been found that the tapers of these two members should be approximately equal, parallel, and directed such that the plunger 30 is narrower at the keycap receiving end and wider (of greater diameter) at its surface which contacts rubber dome 70. This provides a nearly constant tolerance of fit between the plunger and the chimney along the entire length of the plunger thereby providing greater stability (i.e., less wobble) for the keycap when the key is not depressed. Depressing the keycap causes progressively greater tolerances to be achieved throughout the key stroke, minimizing friction and allowing the feel of key action to be determined principally by the rubber dome element. Most preferably, the molds used to fabricate switch housing 20 and plunger 30 have those surfaces which define the inner wall of chimney 60 and the outer surface of plunger 30 polished only in the direction of plunger movement during a normal key stroke. This ensures that any minute grooves or ridges in the chimney walls or on the plunger are aligned thereby minimizing frictional forces. A disadvantage of this design is that plunger 30 must be inserted into switch housing 20 from the underside of the monoblock while keycap 10 must be fastened to plunger 30 from the top. Thus, the monoblock cannot be populated with keycaps and plungers from a single side which fact complicates the assembly operation.

In the illustrated embodiment, chimney 60 has an interior diameter of from about 0.280 inch to about 0.282 inch with a draft angle of about 0.25 degree. Plunger 30 has a nominal diameter (not including up stops or antirotation ribs) of from about 0.2770 to about 0.2790 inch with a draft angle of about 0.25 degree.

It will be appreciated by those skilled in the art that the inclusion of draft angles in the design facilitates the removal of the injection molded parts from the mold. However, the draft angles necessary to practice the present invention can be considerably less than those typically selected only for mold releasing purposes. For example, in the illustrated embodiment a taper of 0.25 degree was employed on the bearing surfaces of the housing and plungers while a draft angle of about 3 degrees was employed on nonbearing surfaces for the purpose of facilitating release of the part from the injection mold. It is contemplated that the above-disclosed invention may be practiced with tapers of from about 0.25 degree to about 1 degree.

The foregoing description has been directed to particular embodiments of the invention in accordance with the requirements of the United States patent statutes for the purposes of illustration and explanation. It will be apparent to those skilled in this art, however, that many modifications and changes in the apparatus and methods set forth will be possible without departing from the scope and spirit of the invention. It is intended that the following claims be interpreted to embrace all such modifications and changes.

What is claimed is:

1. A key-actuated switch comprising:

a keycap;

a generally cylindrical plunger having an upper surface, a lower surface and a tapered outer surface such that the diameter of the plunger is greater at the lower surface than at the upper surface and fixedly connectable to the keycap such that depression of the keycap causes axial movement of the plunger;

a first projecting member on the outer surface of the plunger said first projecting member having an upper, generally planar surface substantially parallel with the upper surface of the plunger;

a second projecting member on the outer surface of the plunger said second projecting member having an upper, generally planar surface substantially parallel with the upper surface of the plunger said second projecting member being more flexible than said first projecting member;

a housing member comprising an upper surface, a lower surface, a generally cylindrical opening from the upper surface to the lower surface, said cylindrical opening having tapered walls such that the diameter of the generally cylindrical opening at the upper surface is less than the diameter of the generally cylindrical opening at the lower surface with said taper being substantially the same as the taper of the plunger and having the plunger contained within the cylindrical opening such that the plunger is moved in the axial direction within the confines of said cylindrical opening when the keycap is depressed, a second stop surface positioned adjacent the cylindrical opening such that when the plunger is upwardly inserted into the cylindrical opening a predetermined distance, the upper, generally planar surface of the second projecting member attached to the outer surface of the cylindrical member contacts the second stop surface of said housing member thereby limiting normal, upward movement of the plunger, and a first stop surface positioned adjacent the cylindrical opening such that when the plunger is urged in the upward direction past the contact point of the second projecting member with the second stop surface, the upper, generally planar surface of the first projecting member contacts the first stop surface thereby preventing withdrawal of the plunger;

a resilient member that recovers its original shape when released after being distorted said resilient member being positioned below the plunger such that when the keycap is depressed the plunger moves downward within the cylindrical opening of the housing member, contacting and distorting the resilient member, and when the keycap is released the resilient member recovers its original shape and urges the plunger upward in the cylindrical opening of the housing member until the second projecting member contacts the second stop surface thereby limiting upward movement of the plunger; and, electrical switch means for converting movement of the plunger in the axial direction into an electrical signal said switch means being operatively coupled to the plunger such that depression of the keycap and the resulting axial movement of the plunger in the downward direction actuates said switch means thereby producing an electrical signal.

* * * * *